United States Patent
Kudimow et al.

(10) Patent No.: US 12,068,098 B2
(45) Date of Patent: Aug. 20, 2024

(54) RESIDUAL CURRENT SENSOR FOR HIGH CURRENTS

(71) Applicant: Vacuumschmelze GmbH & Co. KG, Hanau (DE)

(72) Inventors: Sebastian Kudimow, Hanau (DE); Daniel Jordan, Hanau (DE)

(73) Assignee: Vacuumschmelze GmbH & Co. KG, Hanau (DE)

( * ) Notice: Subject to any disclaimer, the term of this patent is extended or adjusted under 35 U.S.C. 154(b) by 0 days.

(21) Appl. No.: 17/866,818

(22) Filed: Jul. 18, 2022

(65) Prior Publication Data
US 2023/0021222 A1    Jan. 19, 2023

(30) Foreign Application Priority Data

Jul. 19, 2021 (DE) .......... 102021118575.0
May 11, 2022 (DE) .......... 102022111747.2

(51) Int. Cl.
G01R 15/20 (2006.01)
G01R 19/00 (2006.01)
H01F 27/245 (2006.01)

(52) U.S. Cl.
CPC ........... *H01F 27/245* (2013.01); *G01R 15/20* (2013.01); *G01R 19/0092* (2013.01)

(58) Field of Classification Search
CPC .. G01R 15/20; G01R 15/207; G01R 19/0092; H01F 27/245
See application file for complete search history.

(56) References Cited

U.S. PATENT DOCUMENTS

2012/0268114 A1* 10/2012 Disselnkotter ....... G01R 15/207
                                                          324/253
2013/0057272 A1*  3/2013 Lenhard ............... G01R 15/185
                                                          324/252

FOREIGN PATENT DOCUMENTS

DE        102011080041 A1    4/2013

* cited by examiner

*Primary Examiner* — Dominic E Hawkins
(74) *Attorney, Agent, or Firm* — Dickinson Wright PLLC

(57) ABSTRACT

A magnetic core for a current sensor is provided. The magnetic core comprises a first and a second core part, each of which is formed from a stack made up of a plurality of sheet metal layers. The second core part has a first end piece structured such that some of the sheet metal layers are longer and protrude beyond the remaining, shorter sheet metal layers. The first core part has a second end piece which is structured inversely to the first end piece of the second core part. The first core part and the second core part are joined together at a connection point such that the longer sheet metal layers of the first end piece and the second end piece overlap at the connection point, wherein the overlap takes place at a number of interfaces that is at least two less than the number of sheet metal layers.

13 Claims, 4 Drawing Sheets

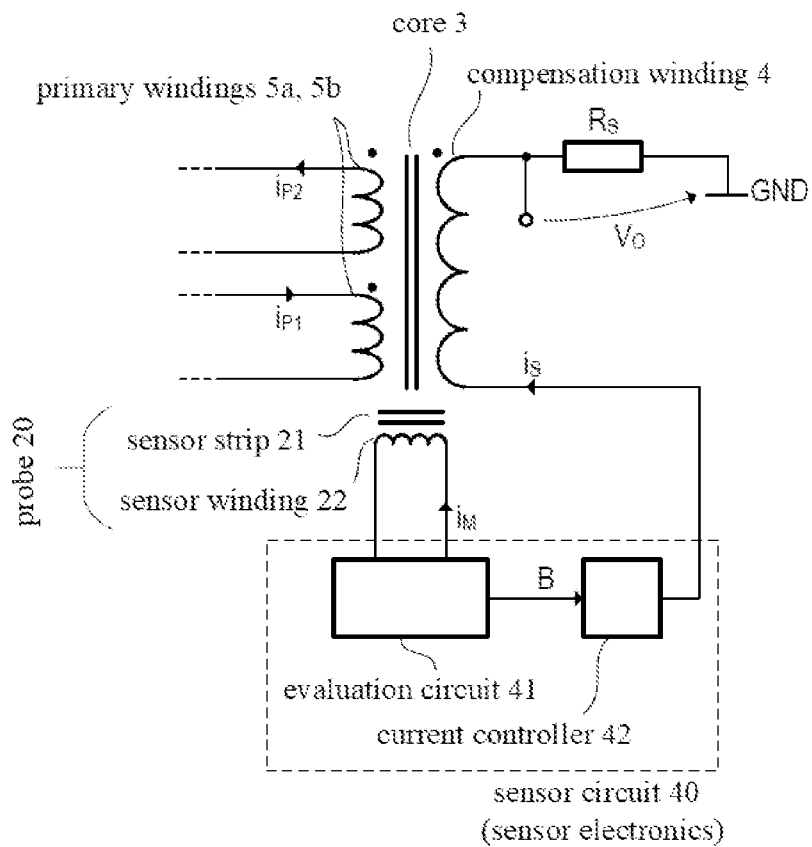
Fig. 1
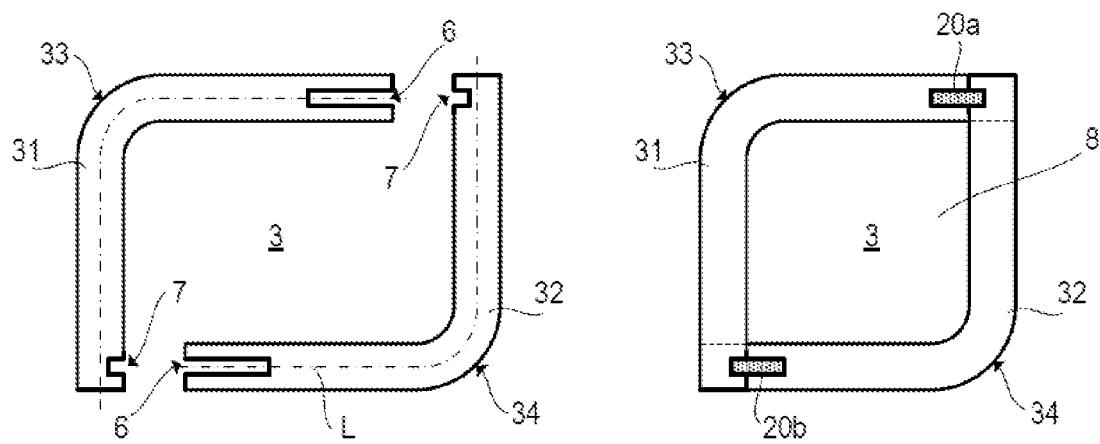
Fig. 2 (a) (b)

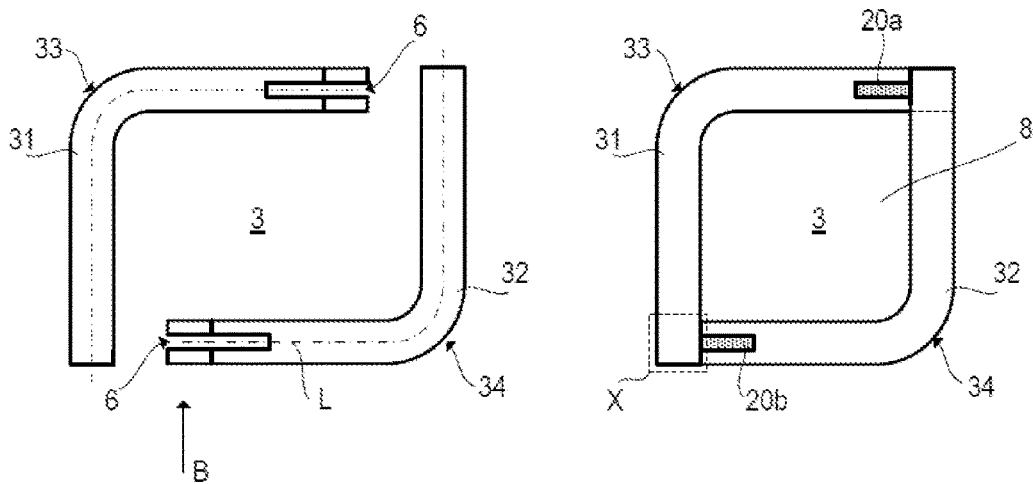
Fig. 3    (a)          (b)
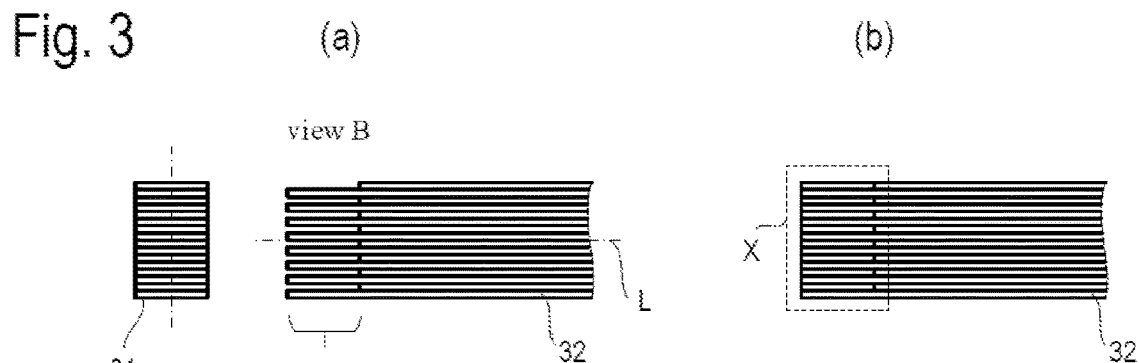
Fig. 4    (a)          (b)
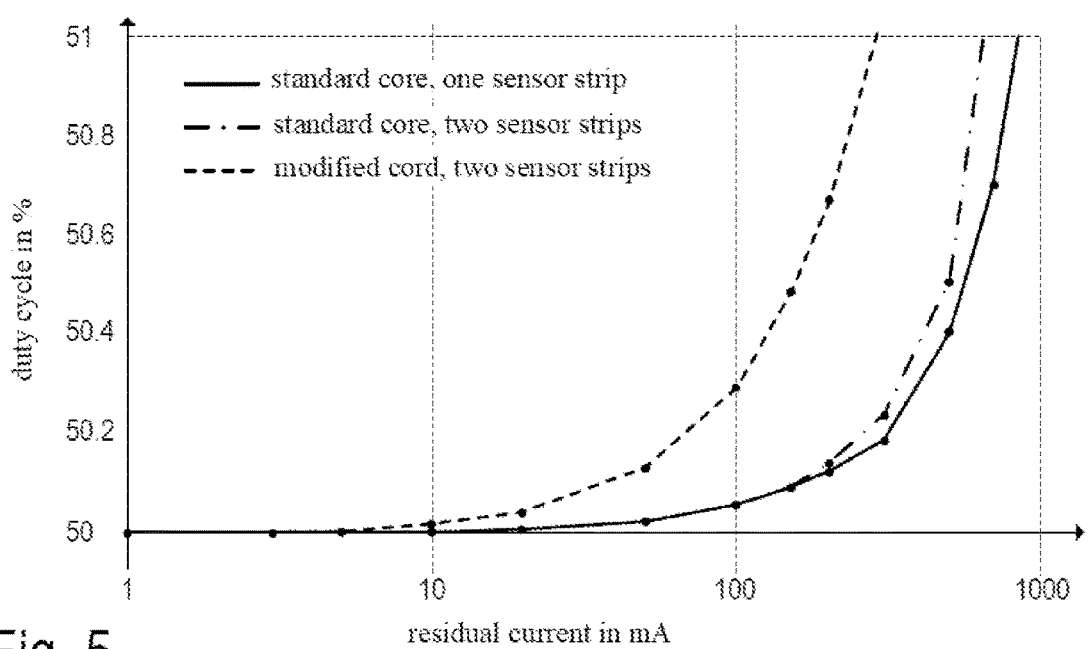
Fig. 5 view B

RESIDUAL CURRENT SENSOR FOR HIGH CURRENTS

This U.S. patent application claims priority to DE Patent Application No. 102021118575.0, filed Jul. 19, 2021, the entire contents of which is incorporated herein by reference in its entirety.

TECHNICAL AREA

The present description relates to the field of current sensors, in particular a residual current sensor for comparatively high currents.

BACKGROUND

In the contactless measurement of currents, current sensors are primarily used in which the magnetic field generated by a current to be measured (primary current) flowing through a so-called primary conductor is evaluated and the current actually flowing in the primary conductor is determined from this. Contactlessly operating current sensors, i.e., current sensors that do not have any galvanic contact with the primary conductor, are used above all for high currents.

Current sensors can be configured in a variety of ways, in particular with regard to the magnetic field sensors and magnetic modules used therein. Magnetic field sensors (also referred to as magnetic field probes) are primarily inductively-operating sensor types or sensor types based on the Hall effect. In order to focus or conduct the magnetic field, soft magnetic elements (for example, a magnetic core made of soft magnetic material) are used, which are an essential part of a magnetic module.

For example, in the case of so-called compensation current sensors, in which the magnetic field generated by the primary current is compensated to zero by a magnetic field generated by a compensation current of known strength, a magnetic core having a closed structure, such as a circular or rectangular ring structure (toroidal core) is used as the soft magnetic element, wherein typically an air gap is provided for accommodating a magnetic field probe. The residual magnetic field that remains when the compensation is not complete is measured by means of the magnetic field probe and the compensation current is readjusted accordingly. The compensation current is a measure of the primary current.

Such current sensors can also be used for residual current measurement. In this case, two current-carrying primary conductors are usually led through the magnetic core in such a way that the magnetic fields caused by the respective primary currents are destructively superimposed in the magnetic core. The resulting magnetic flux in the magnetic core is therefore proportional to the difference of the primary currents in the two conductors, and the current sensor therefore measures the residual current. The residual current can be several orders of magnitude smaller than the primary current flowing through the two primary conductors. In some applications residual currents of a few milliamperes (for example, 10 mA) are thus to be measured, while the primary currents can be approximately 500 amperes. In this case, the ratio of residual current to primary current is 1:50000.

A further problem with residual current sensors is the asymmetrical arrangement of the two primary conductors (of which the current difference is to be measured) in relation to the magnetic core, which can result in local saturations in the core.

The inventors have set themselves the object of providing a residual current sensor which is capable of measuring very small residual currents with sufficient accuracy even in the case of very high conductor currents.

SUMMARY

This object is achieved by the magnetic core according to embodiments of the present disclosure. Various exemplary embodiments and refinements are the subject matter of the dependent claims.

A magnetic core for a current sensor is described hereinafter. According to one exemplary embodiment, the magnetic core comprises a first and a second core part, each of which is formed from a stack made up of a large number of sheet metal layers. The second core part has a first end piece which is structured in such a way that some of the sheet metal layers are longer and protrude over the remaining, shorter sheet metal layers. The first core part has a second end piece which is structured inversely to the first end piece of the second core part. The first core part and the second core part are joined together at a connection point in such a way that the longer sheet metal layers of the first end piece and the second end piece (310) overlap at the connection point, wherein according to this exemplary embodiment, the structure of the first end piece and the second end piece is designed so that the overlap takes place at a number of interfaces that is at least two (in particular three) less than the number of sheet metal layers. The core is particularly suitable for residual and summation current sensors having two or more primary conductors.

According to a further exemplary embodiment, the sheet metal layers in the first end piece and in the second end piece each form an irregular comb structure. According to a further exemplary embodiment, the longer sheet metal layers of the first end piece contribute less than 40 percent to the total cross-sectional area of all sheet metal layers.

BRIEF DESCRIPTION OF THE DRAWINGS

Exemplary embodiments are explained in more detail below with the aid of figures. The illustrations are not necessarily to scale and the exemplary embodiments are not restricted only to the aspects illustrated. Rather, emphasis is placed on presenting the principles on which the exemplary embodiments are based. In the figures:

FIG. 1 illustrates an example of a compensation current sensor having a flux gate probe with the aid of a block diagram;

FIG. 2 illustrates a first example of a magnetic core joined together from two core parts.

FIG. 3 illustrates a second example of a magnetic core joined together from two core parts.

FIG. 4 illustrates the configuration of an end piece of the core parts of a standard core in order to be able to join the core parts together.

FIG. 5 is a diagram to illustrate the sensitivity of various residual current sensor designs.

DETAILED DESCRIPTION

Figure 6:
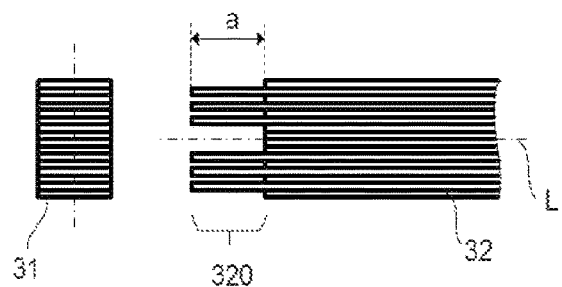
FIGS. 6 and 7 illustrate two exemplary configurations of an end piece of the core parts of a modified magnetic core that is more suitable for residual current sensors.

The exemplary embodiments described here relate to a magnetic core for compensation current sensors. Before various aspects of the magnetic core are discussed in detail, the basic structure of a compensation current sensor, which is known per se, is briefly described in advance. One example is shown in FIG. 1.

According to FIG. 1, the current sensor comprises a soft magnetic core 3 which is magnetically coupled to two primary windings 5a and 5b and a secondary winding/compensation winding 4. The primary winding 5a carries the primary current $i_{P1}$ and the primary winding 5b carries the primary current $i_{P2}$. The difference $i_{P1}$-$i_{P2}$ is the residual current to be measured. The compensation winding 4 carries the compensation current is (secondary current). The magnetic flux components caused by the primary currents $i_{P1}$ and $i_{P2}$ are destructively superimposed in the core 3, so that only the residual current $i_{P1}$-$i_{P2}$ and the secondary current is contribute to the overall magnetic field, wherein the resulting magnetic flux in the core 3 is regulated to zero by adjusting the secondary current is. The regulation takes place with the aid of the current regulator for the secondary current, which will be described later.

The remaining magnetic flux is measured using a magnetic field probe 20 which comprises a ferromagnetic metal strip 21 referred to as a "sensor strip" and a sensor coil 22 enclosing the sensor strip 21. The sensor coil 22 is connected to an evaluation circuit 41, which provides a measured value B representing the magnetic flux. Various suitable evaluation circuits are known per se and are therefore not explained further here.

The evaluation circuit 41 usually comprises an oscillator which generates an excitation current $i_M$ which is fed into the sensor coil 22 and magnetizes it periodically with changing polarity until the sensor strip 21 is saturated. Due to the symmetrical, ideally rectangular hysteresis characteristic curve of the sensor strip 21, any asymmetry present when the sensor coil 22 is alternately magnetized indicates a magnetic flux in the core 3 which is not equal to zero. This asymmetry can be evaluated. The evaluation circuit is coupled to the current controller 42, which adjusts the secondary current is in such a way that the mentioned asymmetry disappears or the measured value B (ideally) becomes zero. Such a magnetic field probe is also referred to as a flux gate probe. An example is described, inter alia, in the publication DE 10045194 A1 (corresponds to US 2004/0204875 A1).

In this state (measured value B is zero), the compensation current is is proportional to the residual current $i_{P1}$-$i_{P2}$, wherein the proportionality factor depends on the ratio of the number of turns of the primary windings 5a and 5b and the number of turns of the compensation winding 4. The regulated compensation current is can be measured very precisely, for example, by means of a measuring resistor $R_S$, and the resulting measured value (for example, the output voltage $V_O = R_S \times i_S$) represents the residual current $i_{P1}$-$i_{P2}$ due to the mentioned proportionality. In practice, the number of turns of the primary windings 5a, 5b is often equal to 1 (i.e., the primary conductors are pushed through the toroidal core).

The concept described above is also suitable for total current measurement in two or more primary conductors, for example for measuring the sum of the currents in the three phase conductors and the neutral conductor of a three-phase connection. Theoretically, this sum should be zero and a total current greater than zero is therefore also referred to as a fault current. The abovementioned residual current $i_{P1}$-$i_{P2}$ can also be the difference in the current in a phase conductor and an associated neutral conductor, which can also be referred to as a fault current. At this point it should be noted that there are also compensation current sensors that work with two magnetic field probes. Two or more compensation coils can also be used.

Another class of current sensors are so-called open-loop current sensors, in which no compensation winding 4 and therefore no current controller 42 are required either. In this case, the field which the residual current $i_{P1}$-$i_{P2}$ (or possibly a fault current) generates in the magnetic core 3 is measured directly in an air gap of the magnetic core with the aid of the probe 20 (and not indirectly via the compensation current). The magnetic cores described here are suitable for both types of current sensors, but have certain advantages with residual current sensors.

The compensation current sensor is capable of measuring both direct currents and alternating currents, wherein the transformer coupling between the primary conductors and the secondary conductor is relevant for the alternating current measurement.

FIG. 2, diagram (a), shows a two-part magnetic core 3 (for example for use in a magnetic module of a residual current sensor, in particular a compensation current sensor) in the not yet assembled state. The two parts of the magnetic core 3 are formed by two identically embodied, L-shaped core parts 31 and 32 (legs), each of which can have, for example, a rectangular core cross section (not shown in FIG. 2). Essentially, the core parts 31 and 32 are two rod cores each bent by 90°. The bending points 33 and 34 can be exactly right-angled with a pointed edge or—as shown in FIG. 1—can be rounded off or beveled in any way. Recesses 6 and 7 are provided on the end faces of the core parts 31 and 32 in the longitudinal direction L (dash-dotted line) of the respective core part, which provide a space for accommodating magnetic field probes in the assembled state of the core 3. The recesses 6 and 7 can be designed in such a way that they are enclosed by core material on all sides, with the exception of a small feedthrough for supply lines of the magnetic field sensors, or are open on one or two sides.

FIG. 2, diagram (b), shows the magnetic core 3 in the assembled state. When the core 3 is assembled, the two legs 31 and 32 are arranged next to one another in such a way that the recesses 6 and 7 of the legs 31 and 32 together form a receptacle space for a magnetic field probe 20a and 20b.

In the assembled state, there is an inner opening 8 for the feedthrough of the two or more primary conductors (cf. FIG. 1, primary conductors 5a, 5b). In other words, the assembled core parts 31 and 32 form a closed toroidal core 3. The joints between the core parts 21 and 32 form air gaps, which, however, have a small gap width, for example less than 0.1 mm. The space between two closely opposed surfaces is commonly referred to as an air gap. The gap width is the distance between the two surfaces in a perpendicular line (normal distance). The effective gap width is the distance, converted to planar surfaces, of spaced-apart nonplanar structures.

FIG. 3, diagrams (a) and (b), shows a modification of the example from FIG. 2, in which a recess 6 is only arranged on one end face of each of the two core parts 31 and 32, which in the assembled state provides a space for the probes 20a and 20b, respectively.

According to the exemplary embodiments described here, the core parts 31 and 32 are made from a material with a comparatively low coercivity $H_C$ (for example, $H_C$<0.02 A/cm) in order to keep the hysteresis error as small as possible. A nickel-iron alloy having a nickel content of 72-83%, for example, VACOPERM® 100 ($H_C$≈0.01 A/cm), can be used for this, which, however, is accompanied by the disadvantage of a lower saturation polarization. In conventional current sensors, nickel-iron alloys with higher saturation polarizations and higher coercivities are often used, in particular nickel-iron alloys having a nickel content of 45-50% for example, PERMENORM® 5000 V5. Since the fields of all primary currents flowing through the sensor inherently pre-compensate (vector addition) in residual current sensors, apart from geometrically caused asymmetries in the field profiles (for example due to an asymmetrical arrangement of the busbars), the core material only has to homogenize part of the superimposed magnetic fluxes in order to make the actually occurring difference (the fault current) measurable. The lower saturation polarization therefore plays a subordinate role in residual current sensors.

As mentioned, in the exemplary embodiments described here, flux gate probes are used as magnetic field sensors (see FIGS. 2 and 3, probes 20a-b). Such probes are often used with current sensors that measure the phase current (and not residual current). However, known designs of flux gate probes are generally not sensitive enough for a residual current sensor. As mentioned, a magnetic field probe (in addition to the required sensor electronics) usually consists of a metal strip made of magnetic material (often referred to as a sensor strip) such as VITROVAC®, around which a coil is wound. The material which the sensor strip consists of does have a non-linear magnetization characteristic curve, but it has a very symmetrical hysteresis. The sensor strip is made from a relatively thin foil having a thickness of 20 µm, for example. Typically, the sensor strip is mounted on a coil carrier and the coil is wound around the coil carrier and therefore also around the sensor strip. In order to increase the sensitivity of the probe, the effective cross-sectional area of the sensor strip can be dimensioned larger than that of probes for conventional current sensors. This increase of the cross-sectional area is achieved either by increasing the thickness of the sensor strip (for example, from 20 µm to 40 µm or more) or by using a stack of two or more sensor strips.

The inventors have found that increasing the sensitivity of the probes 20a and 20b by using a sensor strip with a larger cross-sectional area alone is not sufficient, i.e., does not bring about the desired effect of greater sensitivity of the residual current sensor. In addition, according to the exemplary embodiments described here, the magnetic core 3 outlined in FIG. 2 or 3 is modified, which is discussed below.

FIG. 4 illustrates, by way of example, the connection of the core parts 31 and 32 to form a toroidal magnetic core 3, as is shown in FIG. 3, for example. According to FIG. 4, the core parts 31 and 32 are assembled from a plurality of stacked sheet metal layers (stacked sheet metal layers). In the example shown in FIG. 4, diagram (a), the core parts are formed from 16 stacked sheet metal layers, wherein every second layer at an end piece 320 of the core part 32 is longer by a certain distance than the other layers, so that at the end piece 320, a type of comb structure is formed, which can be plugged into a corresponding comb structure at the end piece of the core part 21. At the opposite ends of the core parts one finds the same comb structures with evenly alternating "tines". In the assembled state, the individual layers of the sheet metal stack from which the core parts 31 and 32 are formed overlap at the connection point X (see FIG. 3, diagram (b) and FIG. 4, diagram (b)). This type of connection is somewhat similar to a box joint used in woodworking, for example. In other words, the even-numbered sheet metal layers of the core part 32 overlap at the connection point X with the odd-numbered sheet metal layers of the core part 31. If there is an even number of sheet metal layers, half of the sheet metal layers overlap a corresponding sheet metal layer of the other core part. If there is an odd number of sheet metal layers, it is one layer less than half. In the assembled state, the shorter sheet metal layers in the end area 320 rest with their end face on the lateral surfaces of the adjacent sheet metal layers of the core part 31 (see FIG. 4, diagram (b)).

A toroidal core made of two core parts 31, 32, which are connected as shown in FIG. 4, is hereinafter referred to as a standard core. Incidentally, the recesses for the probes 20a and 20b (see FIGS. 2 and 3) are directly adjacent to the connection point X (see FIG. 3, diagram (b)) or even protrude into the connection point (see FIG. 2, diagram (b)).

FIG. 5 is a diagram illustrating measured values which show the sensitivity of a residual current sensor. FIG. 5 contains three characteristic curves which show a duty cycle of a modulated output signal of the current sensor as a function of the residual current to be measured, wherein a duty cycle of 50% at the output of the current sensor indicates a residual current of 0 mA. The first characteristic curve (solid line) illustrates the sensitivity of a current sensor having a standard core and a standard probe (flux gate probe having a sensor strip). The second characteristic curve (dash-dotted line) illustrates the sensitivity of a current sensor having a standard core and a modified probe having two superimposed sensor strips (doubled cross-sectional area). It can be seen that the sensitivity of the current sensor due to the described modification of the magnetic field probe has little effect (enlargement of the effective iron cross section of the sensor strip). With currents below 200 mA, practically no difference can be seen in the diagram between the first and the second characteristic curve.

Figure 7:
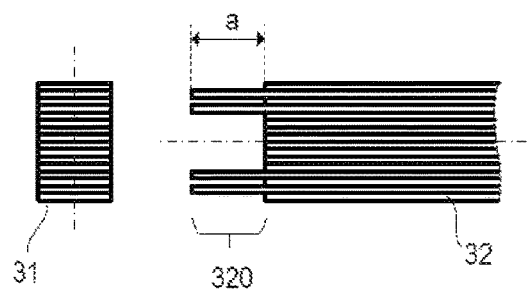

The third characteristic curve (dashed line) illustrates the sensitivity of a current sensor having a modified core and the modified (as described above) probe having increased iron cross section. The modification of the core relates essentially to the type of connection of the two core parts 31 and 32. Various exemplary embodiments are shown in FIGS. 6 and 7. What both variants have in common is that the comb structure at an end piece 320 of the core part 32 is configured in such a way that when the core parts are joined together, fewer sheet metal layers overlap than in the standard core according to FIG. 4, in which every second sheet metal layer overlaps with a corresponding sheet metal layer of the other core part. The majority of the sheet metal layers (in FIG. 6 ten of sixteen (62.5%), in FIG. 7 twelve of sixteen (75%)) each lie—without overlapping—with their narrow end face on a lateral surface of a corresponding sheet metal layer of the respective other core part. A small (in the range of 100 µm) air gap can be formed between the sheet metal layers that adjoin one another on their end faces/lateral surfaces, which increases the leakage flux.

In other words, in the end pieces 320 of the core parts 32, not every second sheet metal layer protrudes beyond the shorter sheet metal layers by a distance a, rather less than approximately 40 percent of the sheet metal layers are longer than the other, shorter sheet metal layers. In the example from FIG. 6, six of sixteen sheet metal layers (i.e., 37.5% of the cross-sectional area) protrude beyond the remaining, shorter sheet metal layers. In the example from FIG. 7, there are four of sixteen sheet metal layers (i.e., 25% of the cross-sectional area). In the case of a standard core having an even number of sheet metal layers, 50% of the sheet metal layers are always longer than the other, shorter sheet metal layers. For a standard core having an odd number of sheet metal layers, it is one layer less. With the usual sheet metal thicknesses of, for example, 0.2 mm-0.5 mm, a magnetic core according to the exemplary embodiments described here can, for example, consist of eight or more sheet metal layers.

From the above explanations it also follows that in a standard core (regular comb structure having its alternately protruding sheet metal layers) having N sheet metal layers there are always N-1 interfaces (interface areas) at which the sheet metal layers of the core parts 331 and 32 overlap. In a modified core, there are N-2 interfaces or less. The theoretical limiting case would then be N=3 sheet metal layers having an overlap at exactly one (N-2) interface (in the end piece 320, the first or the last sheet metal layer would protrude over the other two by a distance a). The overlap at a single interface however, would not be as mechanically stable as a multiple overlap. In a core with N=4 sheet metal layers, an overlap would be possible at two boundary surfaces if the two outer sheet metal layers or the two inner sheet metal layers in the end piece 320 protrude over the others by the distance a (similar to the example from FIG. 7). In a regular comb structure (standard core) having alternating protruding sheet metal layers, the first and third (or the second and fourth) sheet metal layers in the end piece 320 would protrude.

As mentioned above, it can be advantageous if the longer sheet-metal layers in section 320 make up at most 40 percent of the total cross-sectional area of the core. In a core having N=5 layers of sheet metal and overlaps at N-2=3 interfaces, precisely this maximum of 40 percent is achieved (with sheet metal layers of the same thickness). In this case, the first and fourth (or the second and fifth) sheet metal layers are longer than the others in order to achieve an irregular comb structure. A regular comb structure is always present when every second sheet metal layer does not alternately protrude over the adjacent one (cf. FIG. 4, which shows a regular structure), which is equivalent to the longer sheet metal layers in the end piece 320 not being arranged equidistantly (thus not in a regular pattern). In one example, N is greater than or equal to 5 (preferably greater than or equal to 8) for overlaps at six (N-2) or fewer (for example, N-4) interfaces.

Figure 8:
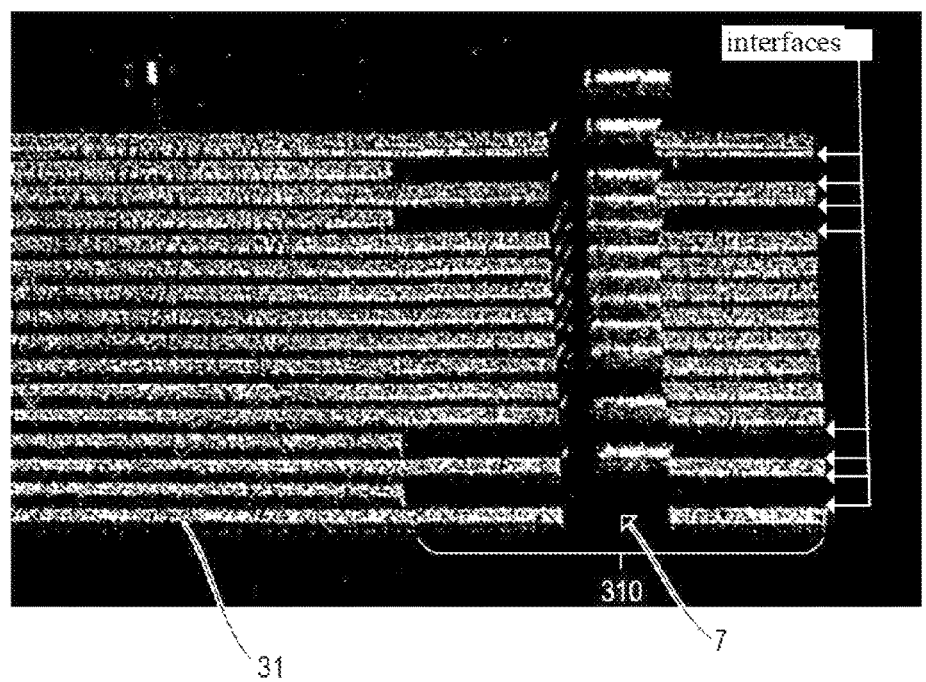
FIG. 8 illustrates an example of the other, inversely-structured end piece of the core parts.

FIG. 8 is a photograph of the end piece 310 of the core part 31, which corresponds to the end piece 320 of the core part 32 from FIG. 7. In the assembled state, a core as shown in FIG. 2 is obtained. In the example shown, with sixteen sheet metal layers there are only eight interfaces at which an overlap takes place. In a standard core having equal number of sheet metal layers, there would be fifteen interfaces.

Figure 9:
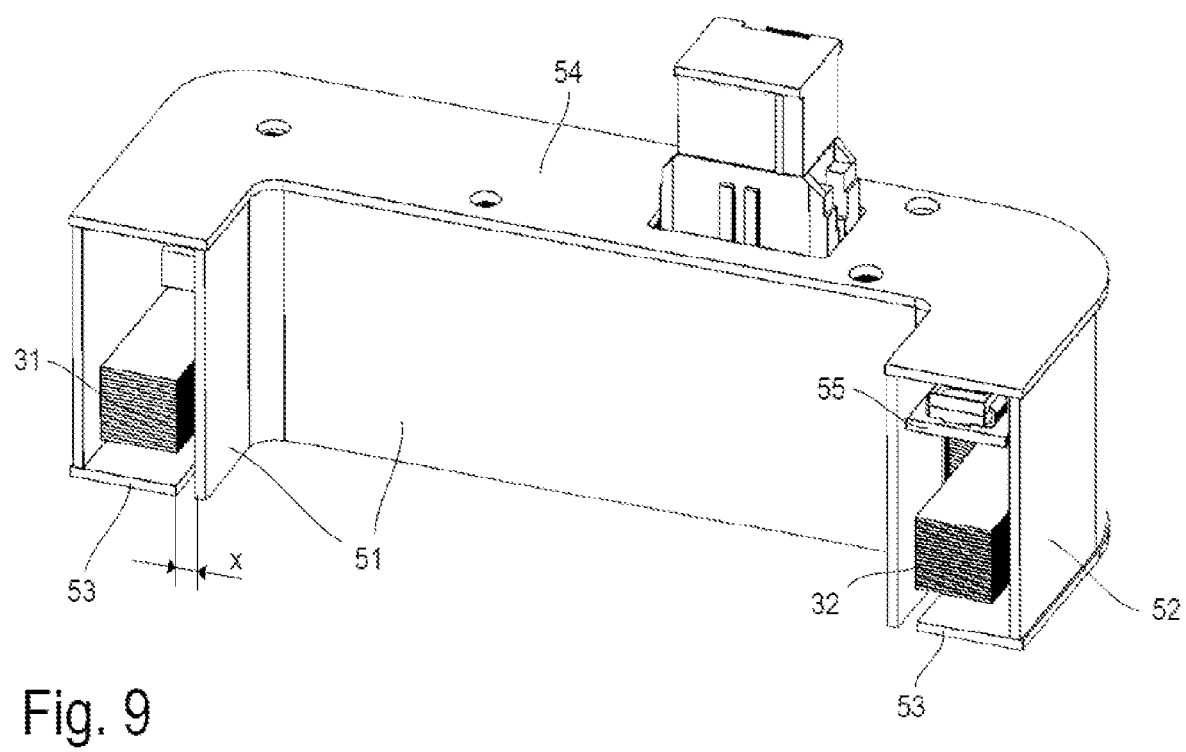
FIG. 9 illustrates the assembled residual current sensor having shielding in a cross-sectional view.

FIG. 9 is a cross-sectional illustration through the assembled residual current sensor having a magnetic core 3 which is assembled from parts 31 and 32 as described above. The joint at which the core parts 31 and 32 are assembled is covered by the shielding (parts 51-54) in FIG. 9 (it would be at the back right in FIG. 9). Inside the housing and above the core 3, a circuit board 55 is arranged, on which the sensor electronics are located (signal conditioning, activation of the magnetic field probes, analog/digital converter, microcontroller, etc.). Various suitable electronic circuits are known per se and are therefore not explained further here.

In FIG. 9, the magnetic core 3 and the compensating coil are enclosed by shielding. The compensation coil is not visible in FIG. 9 because it is covered by the shielding. The shielding increases the immunity of the residual current sensor against external magnetic fields on the one hand and against asymmetries on the other hand, in particular against the asymmetrical arrangement of the primary conductors. The latter is inevitably the case in residual current sensors because two or more primary conductors have to be fed through the magnetic core 3 at the same time, whereas in "normal" current sensors a single primary conductor can be arranged symmetrically in relation to the magnetic core 3.

In the exemplary embodiment of FIG. 9, the shielding comprises an inner shielding ring 51 arranged along the inner circumference of the magnetic core 3, an outer shielding ring 52 arranged along the outer circumference of the magnetic core 3, and an upper shielding plate 54 (cover shielding). and a lower shielding plate 53 (bottom shielding). Such shielding on all sides of the magnetic core and the compensation coil(s) reduces the sensitivity of the residual current sensor to external (parasitic) magnetic fields. So that the transmission behavior in the AC range of the sensor is not impaired by the shielding, a circumferential air gap (gap width x, see FIG. 9) is provided between the inner shielding ring 51 and the bottom shielding 53. The air gap therefore extends along the inner circumference of the magnetic core 3. Alternatively, the air gap can also be arranged at a different point along the inner circumference of the magnetic core 3, for example between the inner shielding ring 51 and the cover shielding 54, or the inner shielding ring is divided in two with an interposed circumferential air gap.

The shielding can be made of a nickel-iron alloy such as Mumetall® or VACOPERM® 100, for example. Together with the above-described modified magnetic core, the shielding enables a comparatively precise residual current measurement. The shielding can be arranged, for example, on the inside of a plastic housing. The plastic housing is not shown in the figures, but in practice encloses the shielding (and thus the magnetic core, compensating coil(s), electronic circuit board, etc.) on all sides. Plastic housings per se are common in current sensors of this type and are therefore not described further here.

The invention claimed is:

1. A current sensor comprising the following:
a magnetic core, the magnetic core including;
a first and a second core part, each comprising a stack made up of a plurality of sheet metal layers,
wherein the second core part has a first end piece which is structured in such a way that some of the sheet metal layers are longer and protrude beyond the remaining, shorter sheet metal layers,
wherein the first core part has a second end piece which is structured inversely to the first end piece of the second core part,
wherein the first core part and the second core part are joined together at a connection point in such a way that the longer sheet metal layers of the first end piece and the second end piece overlap at the connection point,
wherein the structure of the first end piece and the second end piece is configured in such a way that the overlap occurs at a number of interfaces that is at least two less than the number of sheet metal layers;
wherein the core parts are joined together at two connection points and the magnetic core has two recesses which are arranged adjacent to the connection points, and
the current sensor further including two magnetic field probes which are arranged in the recesses in the magnetic core; and
two compensation windings, which are arranged on two opposite regions of the magnetic core.

2. The current sensor as claimed in claim 1, wherein the longer sheet metal layers at the first end piece of the second core part have a total cross-sectional area that makes up less than 40% of the cross-sectional area of the second core part.

3. The current sensor as claimed in claim 1, wherein the stack consists of a plurality of sheet metal layers made up of at least five.

4. The current sensor as claimed in claim 3, wherein the plurality of sheet metal layers is made up of eight sheet metal layers.

5. The current sensor as claimed in claim 1, wherein the sheet metal layers consist of a soft magnetic alloy which has a coercivity of less than 0.02 A/cm.

6. The current sensor as claimed in claim 1, wherein wherein one of the recesses is arranged adjacent to the connection point in the second core part, which recess in particular protrudes into the connection point in the overlaps.

7. The current sensor as claimed in claim 1, wherein the first and second core parts are constructed substantially identically.

8. The current sensor as claimed in claim 1, wherein the two connection points are configured substantially identically.

9. The current sensor of claim 1, furthermore comprising: a shielding that surrounds the magnetic core on all sides and also encloses the compensation windings.

10. The current sensor as claimed in claim 9, wherein the shielding has an air gap extending along the inner circumference of the magnetic core.

11. The current sensor as claimed in claim 1, wherein the current sensor is a residual current sensor or summation current sensor having two or more primary conductors.

12. A magnetic core for a current sensor, comprising the following:
  a first and a second core part, each comprising a stack made up of a plurality of sheet metal layers;
  wherein the second core part has a first end piece which is structured in such a way that some of the sheet metal layers are longer and protrude beyond the remaining, shorter sheet metal layers, and
  wherein the first core part has a second end piece which is structured inversely to the first end piece of the second core part,
  wherein the first core part and the second core part are joined together at two connection points in such a way that the longer sheet metal layers of the first end piece and the second end piece overlap at the connection point;
  wherein the magnetic core has two recesses arranged adjacent to the connection points,
  wherein the sheet metal layers in the first end piece and in the second end piece each form an irregular comb structure,
  wherein two magnetic field probes are arranged in the recesses in the magnetic core, and
  two compensation windings are arranged on two opposite regions of the magnetic core.

13. The magnetic core as claimed in claim 12, wherein the longer sheet metal layers are not arranged equidistantly in the first end piece.

* * * * *